United States Patent
van Dal et al.

(10) Patent No.: US 9,601,629 B2
(45) Date of Patent: Mar. 21, 2017

(54) FACETED FINFET

(71) Applicant: Taiwan Semiconductor Manufacturing Company Limited, Hsin-Chu (TW)

(72) Inventors: Mark van Dal, Linden (BE); Georgios Vellianitis, Heverlee (BE)

(73) Assignee: Taiwan Semiconductor Manufacturing Company Limited, Hsin-Chu (TW)

(*) Notice: Subject to any disclaimer, the term of this patent is extended or adjusted under 35 U.S.C. 154(b) by 0 days.

(21) Appl. No.: 15/173,995

(22) Filed: Jun. 6, 2016

(65) Prior Publication Data
US 2016/0284850 A1 Sep. 29, 2016

Related U.S. Application Data

(62) Division of application No. 13/731,087, filed on Dec. 30, 2012, now Pat. No. 9,362,406.

(60) Provisional application No. 61/736,223, filed on Dec. 12, 2012.

(51) Int. Cl.
*H01L 21/336* (2006.01)
*H01L 29/78* (2006.01)
(Continued)

(52) U.S. Cl.
CPC ...... *H01L 29/7853* (2013.01); *H01L 21/3247* (2013.01); *H01L 21/76224* (2013.01); *H01L 29/66795* (2013.01)

(58) Field of Classification Search
CPC ............ C12Q 2600/158; C12Q 1/6886; C12Q 1/6895; C12Q 2600/156; C12Q 2600/106;
(Continued)

(56) References Cited

U.S. PATENT DOCUMENTS 7,517,764 B2 * 4/2009 Booth, Jr. ........... H01L 29/7851
257/E21.442
8,039,333 B2 10/2011 Kaneko et al.
(Continued)

FOREIGN PATENT DOCUMENTS

TW 200707632 2/2007
TW 200741982 11/2007

OTHER PUBLICATIONS

Corresponding Taiwan application No. 102146029, Taiwan Office action dated Sep. 14, 2016.

*Primary Examiner* — Robert Bachner
(74) *Attorney, Agent, or Firm* — Cooper Legal Group, LLC

(57) ABSTRACT

Among other things, a semiconductor device comprising one or more faceted surfaces and techniques for forming the semiconductor device are provided. A semiconductor device, such as a finFET, comprises a fin formed on a semiconductor substrate. The fin comprises a source region, a channel, and a drain region. A gate is formed around the channel. A top fin portion of the fin is annealed, such as by a hydrogen annealing process, to create one or more faceted surfaces. For example the top fin portion comprises a first faceted surface formed adjacent to a second faceted surface at an angle greater than 90 degrees relative to the second faceted surface, which results in a reduced sharpness of a corner between the first faceted surface and the second faceted surface. In this way, an electrical field near the corner is substantially uniform to electrical fields induced elsewhere within the fin.

20 Claims, 6 Drawing Sheets

(51) Int. Cl.
*H01L 29/66* (2006.01)
*H01L 21/324* (2006.01)
*H01L 21/762* (2006.01)

(58) Field of Classification Search
CPC ........ C12Q 2600/16; C12Q 1/06; C12Q 1/42;
C12Q 1/52; C12Q 1/68; C12Q 2600/13;
C12Q 1/689; C12Q 1/48; C12Q 1/6813
See application file for complete search history.

(56) References Cited

U.S. PATENT DOCUMENTS

| | | | |
|---|---|---|---|
| 2004/0108545 A1* | 6/2004 | Ando | H01L 21/26586 257/329 |
| 2004/0150071 A1* | 8/2004 | Kondo | H01L 21/845 257/623 |
| 2006/0043524 A1* | 3/2006 | Visokay | H01L 29/7831 257/510 |
| 2006/0214226 A1* | 9/2006 | Chen | H01L 21/84 257/347 |
| 2007/0252198 A1* | 11/2007 | Chung | H01L 27/10826 257/330 |
| 2008/0128800 A1* | 6/2008 | Song | H01L 29/4236 257/330 |
| 2012/0043610 A1* | 2/2012 | Cheng | H01L 21/845 257/347 |
| 2012/0224419 A1* | 9/2012 | Inaba | G11C 11/404 365/182 |
| 2013/0307021 A1* | 11/2013 | Ching | H01L 21/82380 257/190 |

* cited by examiner

FACETED FINFET

RELATED APPLICATION

This application is a divisional of and claims priority to U.S. patent application Ser. No. 13/731,087, titled "FACETED FINFET" and filed on Dec. 30, 2012, which is non-provisional filing of U.S. Provisional Application 61/736,223, titled "FACETED FINFET" and filed on Dec. 12, 2012. U.S. patent application Ser. No. 13/731,087 and U.S. Provisional Application 61/736,223 are incorporated herein by reference.

BACKGROUND

To achieve an increase in circuit density of integrated circuits, the size of semiconductor devices, such as field-effect transistors, within such integrated circuits has decreased. Decreasing the size of a semiconductor device can, however, result in a reduction in the length of a channel of the semiconductor device. Reducing the channel length can result in a source region and a drain region of the semiconductor device being closer to one another, which can allow the source and drain region to exert undue influence over the channel, or rather over carriers within the channel, commonly referred to as short-channel effects. Consequently, a gate of a semiconductor device that suffers from short-channel effects has reduced control over the channel, which, among other things, inhibits the ability of the gate to control on and/or off states of the semiconductor device.

SUMMARY

This summary is provided to introduce a selection of concepts in a simplified form that are further described below in the detailed description. This summary is not intended to identify key factors or essential features of the claimed subject matter, nor is it intended to be used to limit the scope of the claimed subject matter.

One or more semiconductor devices and techniques for forming such semiconductor devices are provided herein. A semiconductor device, such as a FinFET, comprises a fin formed on a semiconductor substrate. A gate structure surrounds at least a portion of the fin, such as a channel within a top fin portion of the fin. A source region is formed within a first portion of the fin on a first side of the channel, and a drain region is formed within a second portion of the fin on a second side of the channel. Because the gate structure is formed around the channel on or multiple sides, the gate structure has relatively greater control over the channel, and carriers therein, in relation to a gate structure formed merely above the channel, for example. If, however, the shape of the top fin portion has relatively sharp corners, such as 90 degrees, then electrical fields near the sharp corners are relatively high compared to electrical fields near other portions the fin, which leads to decreased reliability due to non-uniform energy fields developed within the fin.

Accordingly, as provided herein, the fin of the semiconductor device is formed according to a faceted formation. In some embodiments, the fin comprises one or more faceted surfaces that are formed adjacent to one another at angles greater than 90 degrees. For example, the fin comprises a first faceted surface that is formed adjacent to a second faceted surface at an angle greater than 90 degrees relative to the second faceted surface. In some embodiments, the fin comprises a first faceted surface formed substantially parallel to a surface of the semiconductor substrate. The fin comprises a second faceted surface formed substantially perpendicular to the surface of the semiconductor substrate. The fin comprises a third faceted surface formed substantially parallel to the second faceted surface. The fin comprises one or more additional faceted surfaces, such as a fourth faceted surface formed substantially adjacent to the first faceted surface and the second faceted surface.

In some embodiments of forming the semiconductor, the fin is formed on the semiconductor substrate, and is disposed between a first isolation structure and a second isolation structure. The top fin portion of the fin is annealed, such as through a hydrogen annealing process, to create a first faceted surface and a second faceted surface. The first faceted surface is formed adjacent to the second faceted surface at an angle greater than 90 degrees relative to the second faceted surface. In some embodiments, the top fin portion comprises one or more additional faceted surfaces. In some embodiments of annealing, the top fin portion is subjected to a temperature of between about 700 C to about 900 C, which lowers a surface pressure of the top fin portion, such as a silicon (Si) top fin portion, so that the first faceted surface and the second faceted surface are created based upon surface diffusion. For example, the surface pressure is lowered below about 80 Torr. In some embodiments of annealing, the top fin portion is subjected to a temperature of between about 400 C to about 600 C, which lowers the surface pressure of the top fin portion, such as a germanium (Ge) top fin portion, so that the first faceted surface and the second faceted surface are created based upon surface diffusion. For example, the surface pressure is lowered below about 80 Torr. Because the fin is formed according to the faceted formation, the fin has corners that are relatively less sharp as compared to a square or rectangular formation. The decrease in corner sharpness results in electrical fields within the fin that are more uniform as compared to electrical fields developed within fins having relatively sharp corners. In this way, reliability of the semiconductor device is increased due to relatively uniform electric fields within the fin, for example.

The following description and annexed drawings set forth certain illustrative aspects and implementations. These are indicative of but a few of the various ways in which one or more aspects can be employed. Other aspects, advantages, and novel features of the disclosure will become apparent from the following detailed description when considered in conjunction with the annexed drawings.

DETAILED DESCRIPTION

Figure 1:
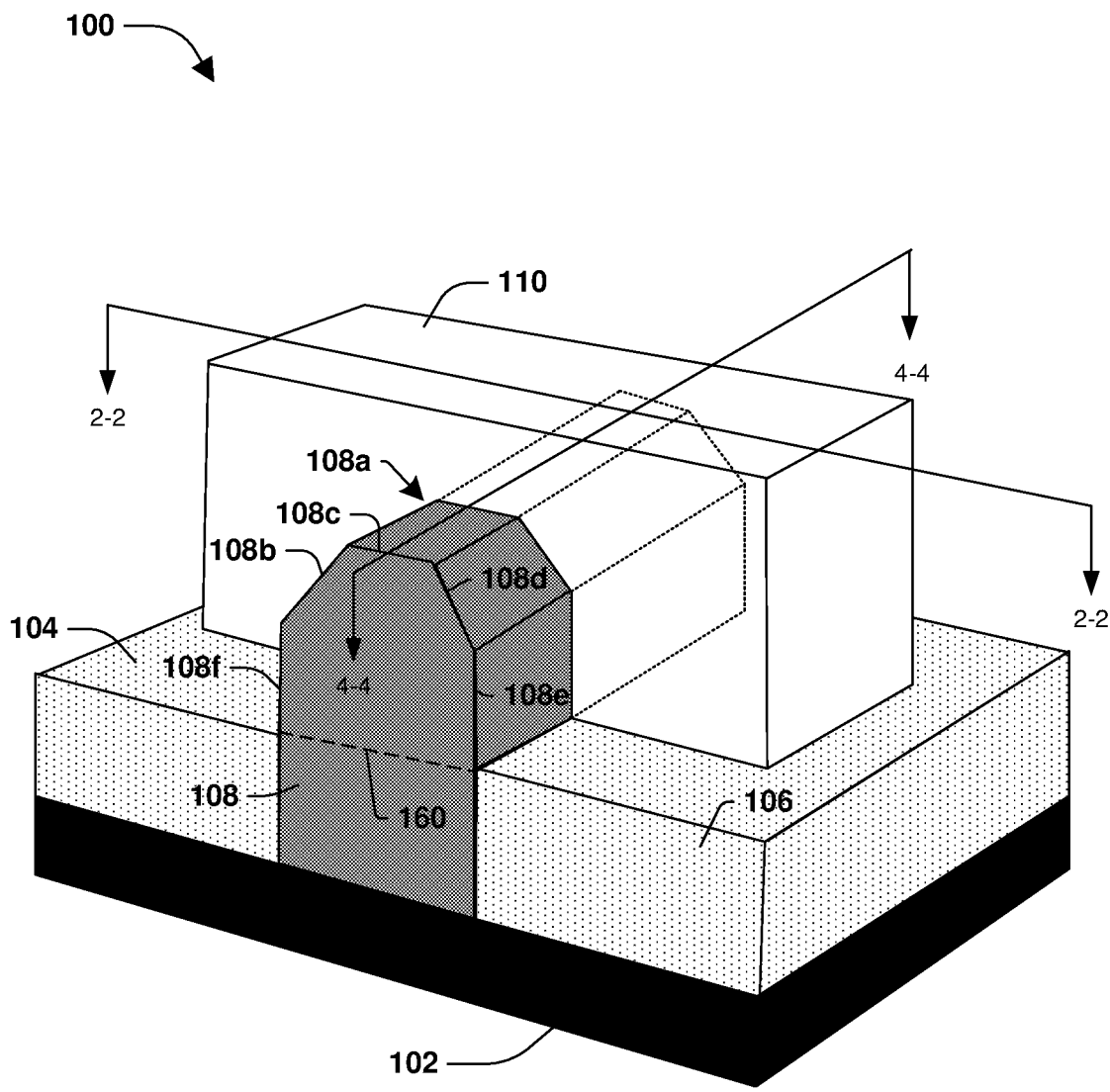
FIG. 1 is an illustration of a semiconductor device comprising one or more faceted surfaces, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

FIG. 1 illustrates an example, according to some embodiments, of a semiconductor device 100. In an example, the semiconductor device 100 comprises a finFET device. The semiconductor device 100 is formed upon a semiconductor substrate, such as a silicon (Si) substrate, and thus comprises at least some of the semiconductor substrate 102 in some embodiments. The semiconductor device 100 comprises a fin 108 formed on the semiconductor substrate 102. In an example, the fin 108 is formed using silicon (Si) associated with the semiconductor substrate 102. In another example, the fin 108 comprises a material that is different than the semiconductor substrate 102, such as Germanium (Ge), that is grown within a trench that is etched into the semiconductor substrate 102. The fin 108 is formed between a first isolation structure 104, such as a first shallow trench isolation (STI) structure, and a second isolation structure 106, such as a second STI structure.

Figure 5:
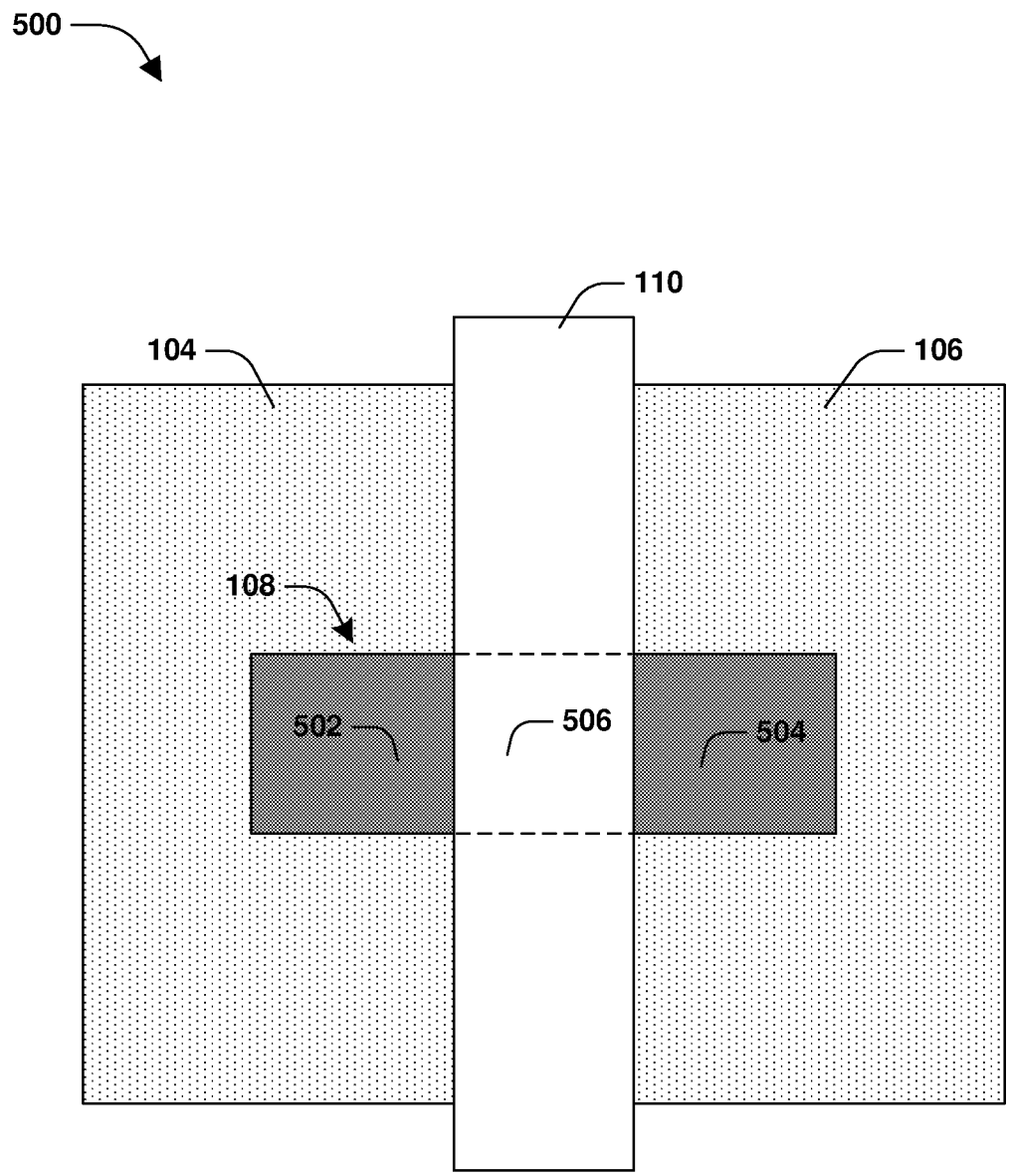
FIG. 5 is an illustration of a top-down view of a semiconductor device, according to some embodiments.

The fin 108 comprises a top fin portion 108a, such as a portion of the fin 108 extending above the dotted line 160 in FIG. 1, that extends above the first isolation structure 104 and the second isolation structure 106. A gate structure 110 is formed around at least a portion of the top fin portion 108a. For example, the gate structure is formed around a channel within the fin 108, and is configured to exert control over the channel in order to turn the semiconductor device 100 on or off, such as by controlling movement of carriers within the channel between a source region and a drain region, for example. In an example, the source region is formed within the fin 108 on a first side of the channel, and the drain region is formed within the fin 108 on a second side of the channel opposite the first side. In an example, a dielectric region, not illustrated, is disposed between the gate structure 110 and at least one of the first isolation structure 104 or the second isolation structure 106. In this way, the gate structure 110, the channel, the source region, and the drain region form at least some of a finFET device, as illustrated in FIG. 5.

If electrical fields associated with the fin 108 are non-uniform, such as due to sharp corners of the top fin portion 108a, then reliability of the semiconductor device 100 is decreased. For example, decreased reliability affects an ability of the gate structure 110 to turn the semiconductor device 100 on or off at a certain bias voltage, which is generally applied to the fin 108 via the gate structure 110. Accordingly, as provided herein, the top fin portion 108a is formed according to a faceted formation that reduces sharpness of corners of the top fin portion 108a in comparison to relatively sharp corners that are associated with a non-faceted formation, such as a square or rectangular formation. Additionally, in some embodiments, forming the top fin portion 108a according to a faceting formation affects crystallographic planes of the fin 108, which affects carrier mobility, particularly in the channel. That is, for example, carrier mobility is different in different crystallographic planes. For example, electron mobility in germanium (Ge) is generally higher in the (111) plane, as compared to other planes, while hole mobility is generally higher in the (110) plane, as compared to other planes. Accordingly, where the fin comprises Ge, for example, forming one or more facets in the top fin portion so that at least some of the facets have a (111) or a (110) surface orientation, as opposed to a (100) orientation, for example, promotes desired operation of the resulting semiconductor device. Accordingly, depending upon, among other things, design specifications, materials used to form the fin, such as silicon or germanium, for example, desired operation of the semiconductor device, such as bias voltage needed to cause carriers to conduct in the channel between the source region and the drain region or have the semiconductor device turn off or on, for example, fabrication processing parameters, such as annealing temperatures, pressures, ambient gasses, etc. for example, can be controlled, adjusted, etc. so that the fin 108 or faceted portions thereof have desired crystallographic planes, for example.

In some embodiments of the faceted formation, the top fin portion 108a comprises a first faceted surface 108b and a second faceted surface 108c. The first faceted surface 108b is formed adjacent to the second faceted surface 108c at an angle that is greater than 90 degrees relative to the second faceted surface 108c. In some embodiments of the faceted formation, the top fin portion 108a comprises one or more additional faceted surfaces. For example, the top fin portion 108a comprises a third faceted surface 108d, a fourth faceted surface 108e, and a fifth faceted surface 108f. In an example, the second faceted surface 108c is formed adjacent to the third faceted surface 108d at an angle greater than 90 degrees relative to the third faceted surface 108d. In this way, sharpness of corners of the top fin portion 108a is reduced because of the faceted formation having angles that are 90 degrees or more between adjacent faceted surfaces.

Figure 2:
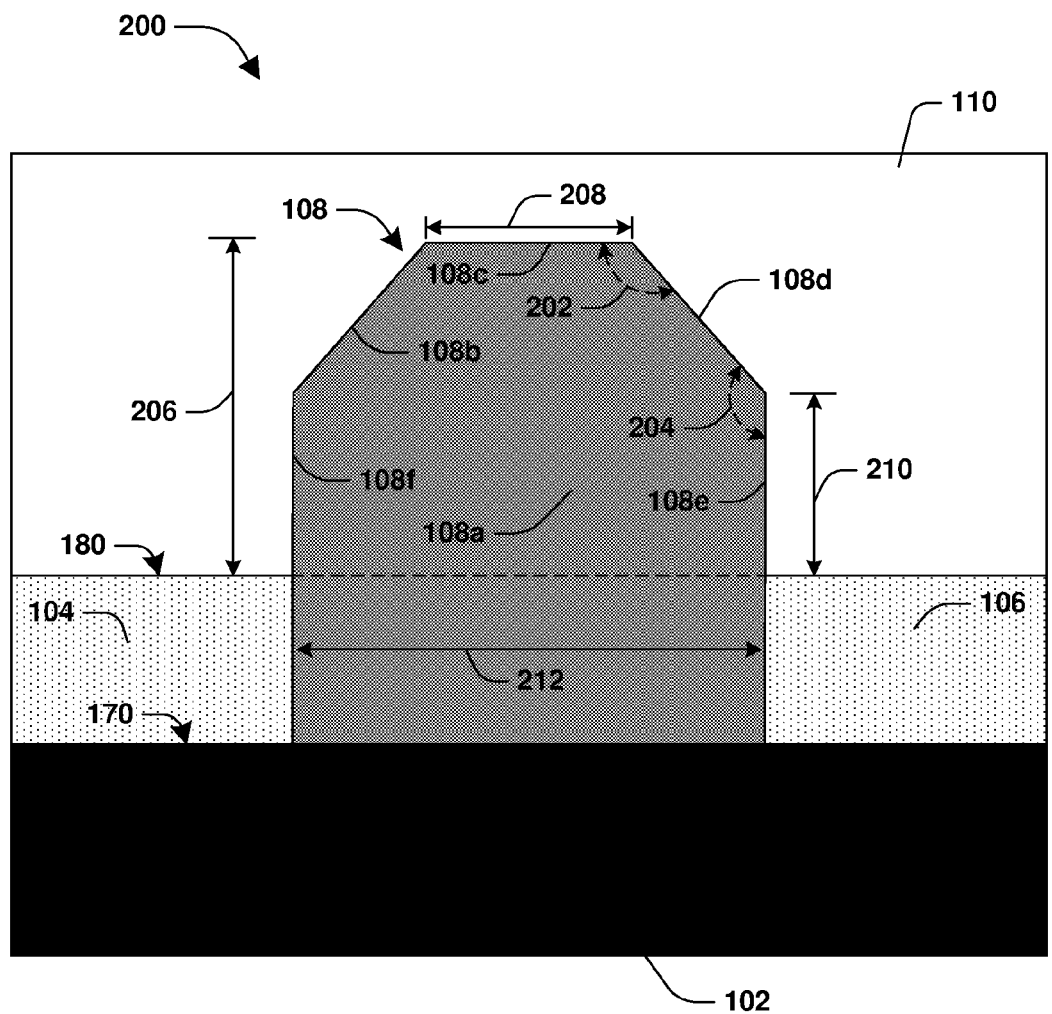
FIG. 2 is an illustration of a cross-sectional view of a semiconductor device taken along line 2-2 of FIG. 1, according to some embodiments.

FIG. 2 illustrates an example 200, in accordance with various embodiments, of a cross-sectional view of a semiconductor device 100 taken along line 2-2 of FIG. 1. The semiconductor device 100 is formed upon a semiconductor substrate, such as a silicon (Si) substrate, and thus comprises at least some of the semiconductor substrate 102 in some embodiments. A first isolation structure 104 and a second isolation structure 106 are formed upon the semiconductor substrate 102. The semiconductor device 100 comprises a fin 108 disposed between the first isolation structure 104 and the second isolation structure 106. The fin 108 comprises a top fin portion 108a that is at least partially surrounded by a gate structure 110. The top fin portion 108a is formed according to a faceted formation that reduces sharpness of corners of the top fin portion 108a. In this way, substantially more uniform electrical fields are developed within the fin 108 because electrical fields near the corners of the top fin portion 108a are substantially normalized with electrical fields near other portions of the fin 108, such as a middle portion of the top fin portion 108a.

In some embodiments of the faceted formation, the top fin portion 108a comprises a first faceted surface 108b, a second faceted surface 108c, a third faceted surface 108d, a fourth faceted surface 108e, and a fifth faceted surface 108f. It is to be appreciated that the top fin portion 108a can comprise any number of faceted surfaces, and is not limited to five faceted surfaces. In an example, the second faceted surface 108c is formed substantially parallel to a surface 170 of the semiconductor substrate 102. The fourth faceted surface 108e is formed substantially perpendicular to the surface 170 of the semiconductor substrate 102. The fifth faceted surface 108f is formed substantially parallel to the fourth faceted surface 108e. The first faceted surface 108b is formed adjacent to the second faceted surface 108c and the fifth faceted surface 108f. The third faceted surface 108d is formed substantially adjacent to the second faceted surface 108c and the fourth faceted surface 108e. In some embodiments, one or more of the first faceted surface 108b or the third faceted surface 108d are formed at an angle of about 45 degrees relative to the surface 170 of the semiconductor substrate 102. In some embodiments of the faceted formation, one or more faceted surfaces are formed adjacent to one another at angles that are greater than 90 degrees. In an example, a first angle 202 between the second faceted surface 108c and the third faceted surface 108d is greater than 90 degrees. In another example, a second angle 204 between the third faceted surface 108d and the fourth faceted surface 108e is greater than 90 degrees.

In some embodiments of the top fin portion 108a, the second faceted surface 108c is formed at a first distance 206 from a surface 180 of the first isolation structure 104. For example, the first distance 206, representing a height of the top fin portion 108a, is between about 10 nm to about 50 nm. A length 210 of the fourth faceted surface 108e is between about 0 nm to about 40 nm, for example. In an example, the length 210 is less than the first distance 206. A width 212 of the top fin portion 108a is between about 5 nm to about 40 nm, for example. A length 208 of the second faceted surface 108c is between about 0 nm to about 10 nm, for example. It is to be appreciated that the distance, height, length and width values are merely non-limiting examples of some embodiments of the fin 108 and top fin portion 108a.

Figure 3:
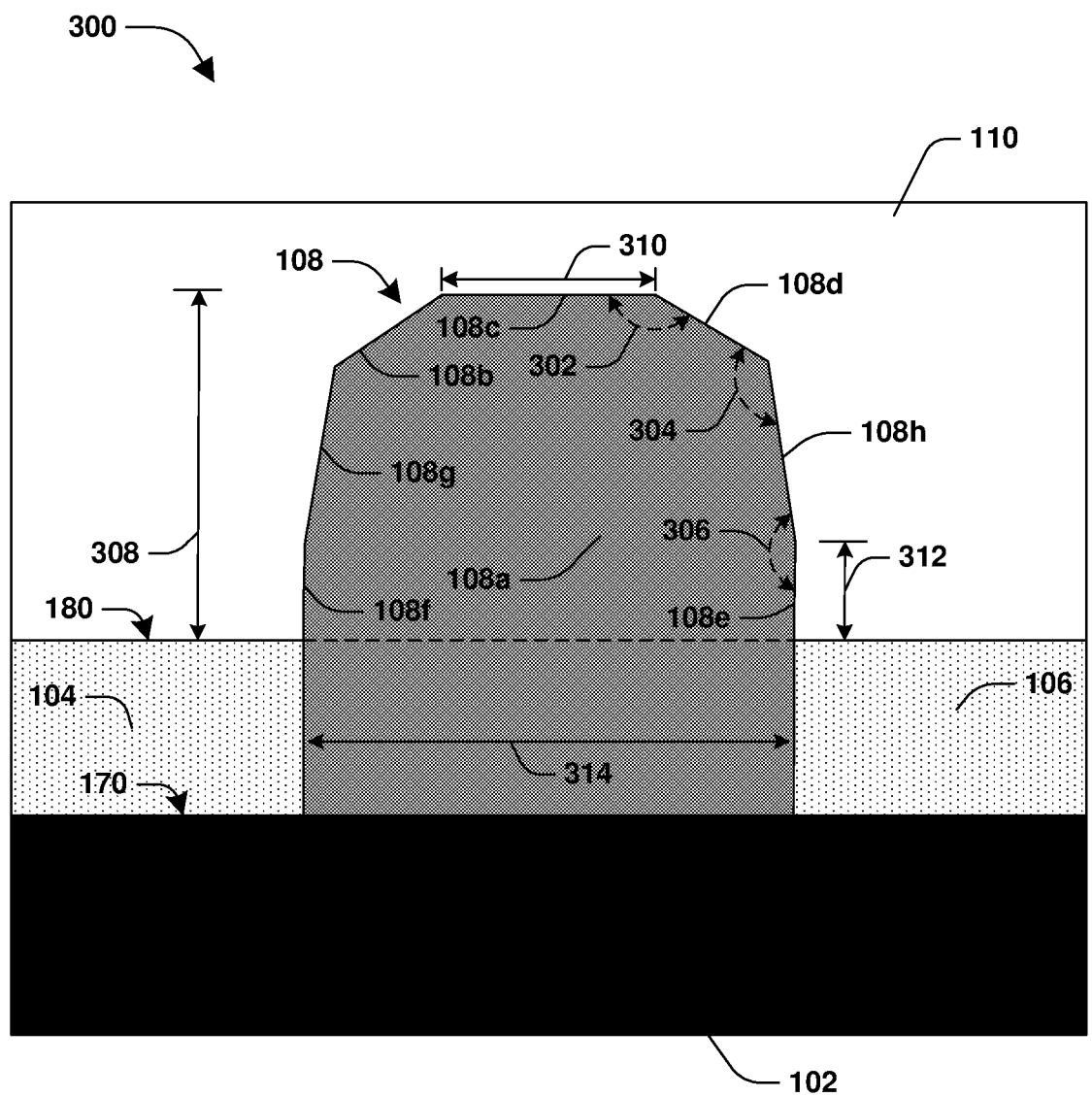
FIG. 3 is an illustration of a cross-sectional view of a semiconductor device, according to some embodiments.

FIG. 3 illustrates an example 300, in accordance with various embodiments, of a cross-sectional view of a semiconductor device 100. The semiconductor device 100 is formed upon a semiconductor substrate, such as a silicon (Si) substrate, and thus comprises at least some of the semiconductor substrate 102 in some embodiments. A first isolation structure 104 and a second isolation structure 106 are formed upon the semiconductor substrate 102. The semiconductor device 100 comprises a fin 108 disposed between the first isolation structure 104 and the second isolation structure 106. The fin 108 comprises a top fin portion 108a. A gate structure 110 surrounds at least a portion of the top fin portion 108a. The top fin portion 108a is formed according to a faceted formation.

In some embodiments of the faceted formation, the top fin portion 108a comprises a first faceted surface 108b, a second faceted surface 108c, a third faceted surface 108d, a fourth faceted surface 108e, a fifth faceted surface 108f, a sixth faceted surface 108g, and a seventh faceted surface 108h. It is to be appreciated that the top fin portion 108a can comprise any number of faceted surfaces. In an example, the second faceted surface 108c is formed substantially parallel to a surface 170 of the semiconductor substrate 102. The fourth faceted surface 108e is formed substantially perpendicular to the surface 170 of the semiconductor substrate 102. The fifth faceted surface 108f is formed substantially parallel to the fourth faceted surface 108e. The first faceted surface 108b is formed adjacent to the second faceted surface 108c and the sixth faceted surface 108g. The third faceted surface 108d is formed substantially adjacent to the second faceted surface 108c and the seventh faceted surface 108h. The sixth faceted surface 108g is formed substantially adjacent to the first faceted surface 108b and the fifth faceted surface 108f. The seventh faceted surface 108h is formed substantially adjacent to the third faceted surface 108d and the fourth faceted surface 108e. In some embodiments of the faceted formation, one or more faceted surfaces are formed adjacent to one another at angles that are greater than 90 degrees. In an example, a third angle 302 between the second faceted surface 108c and the third faceted surface 108d is greater than 90 degrees. In another example, a fourth angle 304 between the third faceted surface 108d and the seventh faceted surface 108h is greater than 90 degrees. In another example, a fifth angle 306 between the seventh faceted surface 108h and the fourth faceted surface 108e is greater than 90 degrees.

In some embodiments of the top fin portion 108a, the second faceted surface 108c is formed at a first distance 308 from a surface 180 of the first isolation structure 104. For example, the first distance 308, representing a height of the top fin portion 108a, is between about 10 nm to about 50 nm. A length 312 of the fourth faceted surface 108e is between about 0 nm to about 40 nm, for example. In an example, the length 312 is less than the first distance 308. In another example, the length 312 is less than a length 210 of the fourth faceted surface 108e depicted in example 200 of FIG. 2. A width 314 of the top fin portion 108a is between about 5 nm to about 40 nm, for example. A length 310 of the second faceted surface 108c is between about 0 nm to about 10 nm, for example. It is to be appreciated that the distance, height, length and width values are merely non-limiting examples of some embodiments of the fin 108 and top fin portion 108a.

Figure 4:
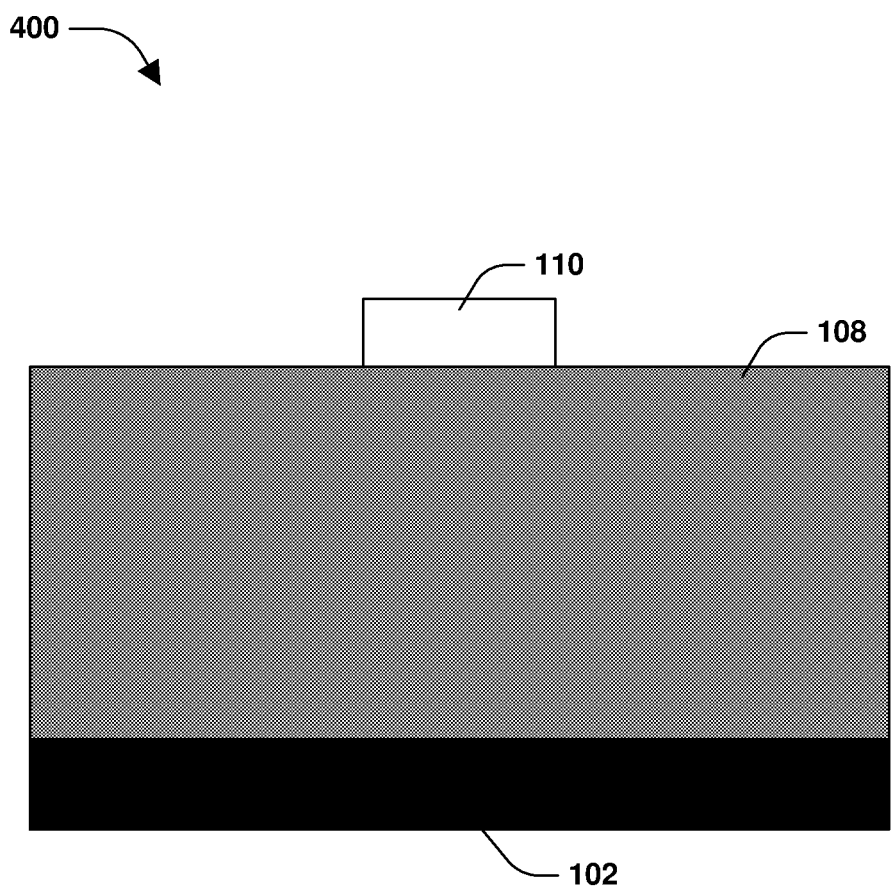
FIG. 4 is an illustration of a cross-sectional view of a semiconductor device taken along line 4-4 of FIG. 1, according to some embodiments.

FIG. 4 illustrates an example 400, in accordance with various embodiments, of a cross-sectional view of a semiconductor device 100 taken along line 4-4 of FIG. 1. The semiconductor device 100 is formed upon a semiconductor substrate, such as a silicon (Si) substrate, and thus comprises at least some of the semiconductor substrate 102 in some embodiments. A fin 108 is formed on the semiconductor substrate 102. The fin 108 comprises a source region, a channel, and a drain region, as illustrated by example 500 of FIG. 5. A gate structure 110 is wrapped around at least a portion of the fin 108, such as the channel of the fin 108. In this way, the gate structure 110 can exercise some degree of control over the channel, and carriers therein, in order to turn the semiconductor device 100 on or off, for example.

FIG. 5 illustrates an example 500, in accordance with various embodiments, of a top-down view of a semiconductor device 100. The semiconductor device 100 is formed upon a semiconductor substrate, not illustrated, such as a silicon (Si) substrate, and thus comprises at least some of the semiconductor substrate 102 in some embodiments. A first isolation structure 104 and a second isolation structure 106 are formed upon the semiconductor substrate 102. A fin 108 is formed between the first isolation structure 104 and the second isolation structure 106. The fin 108 comprises a top fin portion that extends above the first isolation structure 104 and the second isolation structure 106. The fin 108 is formed according to a faceted formation, such that the top fin portion of the fin 108 comprises one or more faceted surfaces. A source region 502 is formed within a first portion of the fin 108, such as by a doping process. A drain region 504 is formed within a second portion of the fin 108, such as by a doping process. The fin 108 comprises a channel 506 between the source region 502 and the drain region 504. The semiconductor device 100 comprises a gate structure 110 that wraps around at least a portion of the channel 506. In this way, the gate structure 110 can exercise some degree of control over the channel 506, and carriers therein, in order to turn the semiconductor device 100 on or off, for example.

Figure 6:
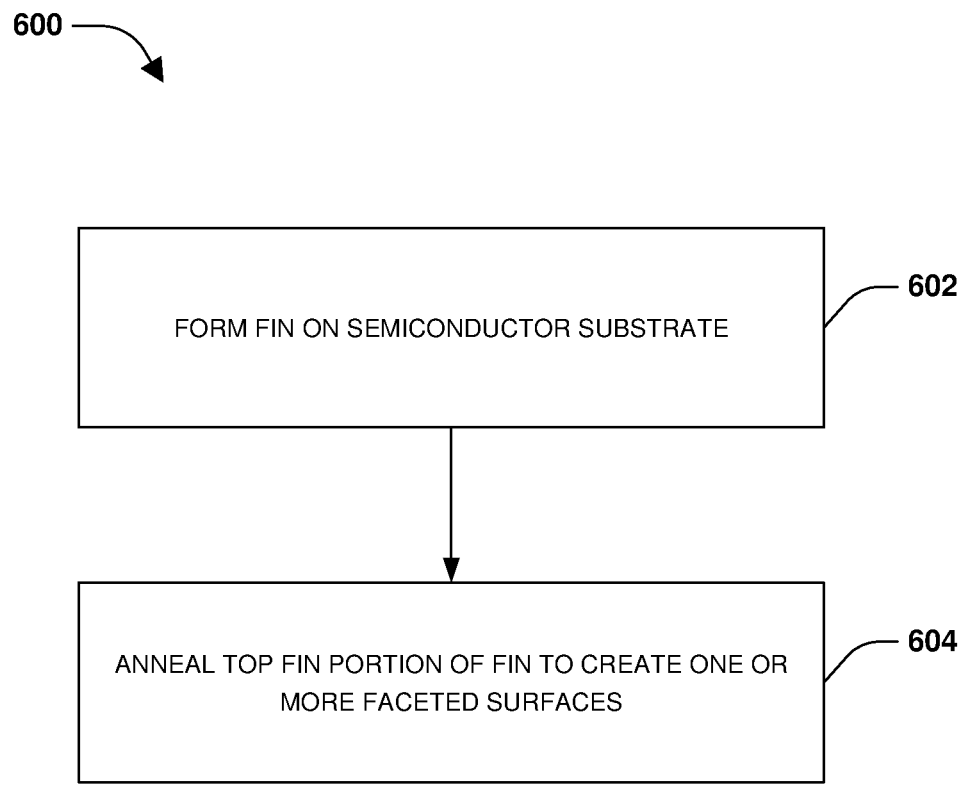
FIG. 6 is a flow diagram illustrating an example method of forming a semiconductor device, according to some embodiments.

An exemplary method 600 of forming a semiconductor device 100, according to some embodiments, is illustrated in FIG. 6. At 602, a fin 108 is formed on a semiconductor substrate 102, and thus comprises at least some of the semiconductor substrate 102 in some embodiments. The fin 108 is disposed between a first isolation structure 104 and a second isolation structure 106. In some embodiments of forming the fin 108 out of silicon (Si), the semiconductor substrate 102 comprises silicon (Si). A first trench is etched into the semiconductor substrate 102. A second trench is etched into the semiconductor substrate 102, resulting in the fin 108 being disposed between the first trench and the second trench. Oxide is deposited into the first trench to form a first shallow isolation trench (STI) as the first isolation structure. Oxide is deposited into the second trench to form a second STI as the second isolation structure. In this way, the fin 108 is created using silicon (Si) from the semiconductor substrate 102. In some embodiments of forming the fin 108 out of a material that is different than the semiconductor substrate 102, such as germanium (Ge), a first trench and a second trench are etched into the semiconductor substrate 102. Oxide is deposited into the first trench to form a first STI as the first isolation structure. Oxide is deposited into the second trench to form a second STI as the second isolation structure. A third trench is etched between the first STI and the second STI. In an example, a material, such as germanium (Ge), is grown within the third trench to form the fin 108. In an example, a seed layer is used within the third trench to facilitate forming the fin 108.

One or more faceted surfaces are created within the fin 108 based upon various fabrication conditions, such as annealing temperature, a use of hydrogen during annealing, a decrease in surface pressure resulting in surface diffusion, an orientation of the fin 108, an orientation of an initial substrate surface of the semiconductor substrate 102, etc. Such fabrication conditions can be adjusted to modify aspects of faceted surface formation, such as a number of faceted surfaces, angles between adjacent faceted surfaces, faceted surface lengths, etc.

Accordingly, at 604, a top fin portion 108a of the fin 108 is annealed, such as through a hydrogen annealing process, to create a first faceted surface and a second faceted surface. The first faceted surface is formed adjacent to the second faceted surface at an angle that is greater than 90 degrees relative to the second faceted surface. In an example, one or more additional faceted surfaces are created on the top fin portion 108a. In some embodiments of annealing a silicon (Si) based fin, the top fin portion 108a is annealed at a temperature of between about 700 C to about 900 C, which lowers a surface pressure of the top fin portion 108a, such as to below about 80 Torr, for example, to create the first faceted surface and the second faceted surface based upon surface diffusion. In some embodiments of annealing a germanium (Ge) based fin, the top fin portion 108a is annealed at a temperature of between about 400 C to about 600 C, which lowers the surface pressure of the top fin portion 108a, such as to below about 80 Torr, for example, to create the first faceted surface and the second faceted surface based upon surface diffusion. A gate structure 110 is formed around the first faceted surface and the second faceted surface. For example, the gate structure 110 is formed around a channel within the fin 108 defined at least in part by the first faceted surface and the second faceted surface and situated between a source region formed within the fin 108 to a first side of the gate structure 110 and a drain region formed within the fin 108 to a second side of the gate structure 110. In this way, the semiconductor device 100 is formed as a finFET device according to a faceted formation.

According to an aspect of the instant disclosure, a semiconductor device is provided. The semiconductor device comprises a fin disposed between a first isolation structure and a second isolation structure that are formed on a semiconductor substrate. The fin comprises a top fin portion extending above the first isolation structure and the second isolation structure. The top fin portion comprises a first faceted surface and a second faceted surface. The first faceted surface is formed adjacent to the second faceted surface at an angle greater than 90 degrees relative to the second faceted surface.

According to an aspect of the instant disclosure, a semiconductor device is provided. The semiconductor device comprises a fin formed on a semiconductor substrate. The fin comprises a top fin portion formed according to a faceted formation. For example, the top fin portion comprises one or more faceted surfaces, such as a first faceted surface formed adjacent to a second faceted surface at an angle greater than 90 degrees relative to the second faceted surface. A gate structure is formed around the top fin portion.

According to an aspect of the instant disclosure, a method for forming a semiconductor device is provided. The method comprises, forming a fin on a semiconductor substrate. The fin is disposed between a first isolation structure and a second isolation structure. A top fin portion of the fin is annealed, such as through a hydrogen annealing process, to create a first faceted surface and a second faceted surface. The first faceted surface is formed adjacent to the second faceted surface at an angle greater than 90 degrees relative to the second faceted surface.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A method for forming a semiconductor device comprising:
   forming a fin on a semiconductor substrate; and
   annealing a top fin portion of the fin to create:
     a first faceted surface defining a portion of a boundary profile of a source/drain region and a portion of a boundary profile of a channel region, and
     a second faceted surface defining a second portion of the boundary profile of the source/drain region and a second portion of the boundary profile of the channel region, wherein:
       the first faceted surface is formed adjacent to the second faceted surface at an angle greater than 90 degrees relative to the second faceted surface.

2. The method of claim 1, wherein the annealing is a hydrogen annealing.

3. The method of claim 1, wherein the annealing causes surface diffusion of the top fin portion, the surface diffusion creating the first faceted surface and the second faceted surface.

4. The method of claim 1, wherein the forming a fin comprises:
   etching the semiconductor substrate to define a raised portion of the semiconductor substrate, wherein the raised portion of the semiconductor substrate is the fin.

5. The method of claim 1, the forming a fin comprising: growing the fin over the semiconductor substrate.

6. The method of claim 5, comprising:
   forming a first shallow trench isolation structure and a second shallow trench isolation structure, wherein the fin is grown over the semiconductor substrate between the first shallow trench isolation structure and the second shallow trench isolation structure.

7. The method of claim 1, comprising forming a gate structure over the first faceted surface and the second faceted surface in the channel region.

8. The method of claim 1, comprising:
   forming a first shallow trench isolation structure and a second shallow trench isolation structure on opposing sides of the fin, the first shallow trench isolation structure and the second shallow trench isolation structure in contact with a bottom fin portion of the fin.

9. The method of claim 8, comprising:
   forming a gate structure over:
     the first shallow trench isolation structure,
     the second shallow trench isolation structure, and
     the first faceted surface and the second faceted surface in the channel region.

10. The method of claim 1, wherein the fin is a Silicon fin and the annealing comprises:
    annealing the top fin portion at a temperature between about 700° C. and about 900° C. to lower a surface pressure of the top fin portion to create the first faceted surface and the second faceted surface based upon surface diffusion.

11. The method of claim 10, the annealing comprising: lowering the surface pressure below about 80 Torr.

12. The method of claim 1, wherein the fin is a Germanium fin the annealing comprises:
    annealing the top fin portion at a temperature between about 400° C. and about 600° C. to lower a surface pressure of the top fin portion to create the first faceted surface and the second faceted surface based upon surface diffusion.

13. The method of claim 12, the annealing comprising: lowering the surface pressure below about 80 Torr.

14. The method of claim 1, wherein, after the annealing, the boundary profile of the source/drain region has a same shape as the boundary profile of the channel region.

15. A method for forming a semiconductor device comprising:
    forming a fin on a semiconductor substrate; and
    annealing a top fin portion of the fin to create:
      a first faceted surface defining a portion of a boundary profile of a source/drain region and a portion of a boundary profile of a channel region, and
      a second faceted surface defining a second portion of the boundary profile of the source/drain region and a second portion of the boundary profile of the channel region, wherein:
        the boundary profile of the source/drain region has a same shape as the boundary profile of the channel region.

16. The method of claim 15, wherein the first faceted surface is formed adjacent to the second faceted surface at an angle greater than 90 degrees relative to the second faceted surface.

17. The method of claim 15, comprising forming a gate structure over the first faceted surface and the second faceted surface in the channel region.

18. The method of claim 15, comprising:
    forming a first shallow trench isolation structure and a second shallow trench isolation structure on opposing sides of the fin, the first shallow trench isolation structure and the second shallow trench isolation structure in contact with a bottom fin portion of the fin.

19. The method of claim 18, comprising:
    forming a gate structure over:
      the first shallow trench isolation structure,
      the second shallow trench isolation structure, and
      the first faceted surface and the second faceted surface in the channel region.

20. A method for forming a semiconductor device comprising:
    forming a fin on a semiconductor substrate;
    forming a first shallow trench isolation structure and a second shallow trench isolation structure on opposing sides of the fin, the first shallow trench isolation structure and the second shallow trench isolation structure in contact with a bottom fin portion of the fin; and
    annealing a top fin portion of the fin to create a first faceted surface defining a portion of a boundary profile of a source/drain region and a portion of a boundary profile of a channel region, wherein the first faceted surface substantially is parallel to a surface of the semiconductor substrate upon which the fin is formed and a length of the first faceted surface is less than a width of the bottom fin portion of the fin.

* * * * *